(12) United States Patent
Glaise

(10) Patent No.: US 6,189,124 B1
(45) Date of Patent: Feb. 13, 2001

(54) METHOD AND APPARATUS FOR A TWO-STEP CALCULATION OF CRC-32

(75) Inventor: Rene Glaise, Nice (FR)

(73) Assignee: International Business Machines Corporation, Armonk, NY (US)

(*) Notice: Under 35 U.S.C. 154(b), the term of this patent shall be extended for 0 days.

(21) Appl. No.: 08/943,678

(22) Filed: Oct. 15, 1997

(30) Foreign Application Priority Data

Oct. 29, 1996 (EP) .................................................. 96480104

(51) Int. Cl.[7] .................................................. H03M 13/00
(52) U.S. Cl. .......................................... 714/758; 714/781
(58) Field of Search ................................ 714/758, 781, 714/783, 757

(56) References Cited

U.S. PATENT DOCUMENTS

| | | | |
|---|---|---|---|
| 4,949,342 | * 8/1990 | Shimbo et al. | 714/763 |
| 5,539,756 | * 7/1996 | Glaise et al. | 714/758 |
| 5,638,370 | * 6/1997 | Seconi et al. | 370/466 |
| 5,689,518 | * 11/1997 | Galand et al. | 714/752 |
| 5,724,034 | * 3/1998 | Nielander et al. | 341/94 |
| 5,832,002 | * 11/1998 | Endresen et al. | 714/758 |
| 5,935,268 | * 8/1999 | Weaver | 714/758 |
| 5,951,707 | * 9/1999 | Christensen et al. | 714/752 |

* cited by examiner

Primary Examiner—Christine Trinh L. Tu
Assistant Examiner—Esaw Abraham
(74) Attorney, Agent, or Firm—Daniel E. McConnell

(57) ABSTRACT

A method and an apparatus to calculate the CRC-32 (Cyclic Redundancy Checking) codes of a bit stream while improving the process time and simple to implement. The CRC-32 calculation is used for FCS (Frame Check Sequence) error checking code of bit stream messages sent over a fixed size packet networks when the high speeds require reducing the processing time in the network access nodes. This CRC-32 calculation is also used for FCS checking in the network equipment receiving said packetized bit stream messages. This invention applies particularly to messages conveyed via AAL5 type cells in ATM networks. The CRC-32 per byte computation of the prior art is replaced by a simple per byte CRC-R computation followed by a one pass CRC-32 computation of the R bit stream, result of the CRC-R computation. The CRC-R codes being generated by a M(X), a polynomial of degree R, multiplier of the generator polynomial of degree 32, $(X) = X^{32} + X^{26} + X^{23} + X^{22} + X^{16} + X^{12} + X^{11} + X^{10} + X^8 + X^7 + X^5 + X^4 + X^2 + X + 1$, the generator of the Galois Field constituting the CRC-32 codes.

8 Claims, 9 Drawing Sheets

FIG. 3A

| Current RFD and data bits to combine in order to get the next RFD value | | |
|---|---|---|
| Next RFD value | From current RFD(0-122) value and incoming data byte B(0-7) | N-way XOR |
| RFD (0) | B(0), RFD(115) | 2 |
| RFD (1) | B(1), RFD(116) | 2 |
| RFD (2) | B(2), RFD(117) | 2 |
| RFD (3) | B(3), RFD(118) | 2 |
| RFD (4) | B(4), RFD(119) | 2 |
| RFD (5) | B(5), RFD(120) | 2 |
| RFD (6) | B(6), RFD(121) | 2 |
| RFD (7) | B(7), RFD(122) | 2 |
| RFD (8-22) | RFD(0-14).....SHIFTED | - |
| RFD (23) | RFD(15, 115) | 2 |
| RFD (24) | RFD(16, 116) | 2 |
| RFD (25) | RFD(17, 117) | 2 |
| RFD (26) | RFD(18, 118) | 2 |
| RFD (27) | RFD(19, 119) | 2 |
| RFD (28) | RFD(20, 120) | 2 |
| RFD (29) | RFD(21, 121) | 2 |
| RFD (30) | RFD(22, 122) | 2 |
| RFD (31-45) | RFD(23-37)....SHIFTED | - |
| RFD (46) | RFD(38, 115) | 2 |
| RFD (47) | RFD(39, 116) | 2 |
| RFD (48) | RFD(40, 117) | 2 |
| RFD (49) | RFD(41, 118) | 2 |
| RFD (50) | RFD(42, 119) | 2 |
| RFD (51) | RFD(43, 120) | 2 |
| RFD (52) | RFD(44, 121) | 2 |
| RFD (53) | RFD(45, 122) | 2 |
| RFD (54-63) | RFD(46-55)....SHIFTED | - |
| RFD (64) | RFD(56, 115) | 2 |
| RFD (65) | RFD(57, 116) | 2 |
| RFD (66) | RFD(58, 117) | 2 |
| RFD (67) | RFD(59, 118) | 2 |
| RFD (68) | RFD(60, 119) | 2 |
| RFD (69) | RFD(61, 120) | 2 |
| RFD (70) | RFD(62, 121) | 2 |
| RFD (71) | RFD(63, 122) | 2 |
| RFD (72-83) | RFD(64-75)...SHIFTED | - |

FIG. 3B

| | | |
|---|---|---|
| RFD (84) | RFD(76, 115) | 2 |
| RFD (85) | RFD(77, 116) | 2 |
| RFD (86) | RFD(78, 117) | 2 |
| RFD (87) | RFD(79, 118) | 2 |
| RFD (88) | RFD(80, 119) | 2 |
| RFD (89) | RFD(81, 120) | 2 |
| RFD (90) | RFD(82, 121) | 2 |
| RFD (91) | RFD(83, 122) | 2 |
| RFD (92) | RFD(84, 115) | 2 |
| RFD (93) | RFD(85, 116) | 2 |
| RFD (94) | RFD(86, 117) | 2 |
| RFD (95) | RFD(87, 118) | 2 |
| RFD (96) | RFD(88, 119) | 2 |
| RFD (97) | RFD(89, 120) | 2 |
| RFD (98) | RFD(90, 121) | 2 |
| RFD (99) | RFD(91, 122) | 2 |
| RFD (100-110) | RFD(92-102)...SHIFTED | - |
| RFD (111) | RFD(103, 115) | 2 |
| RFD (112) | RFD(104, 116) | 2 |
| RFD (113) | RFD(105, 117) | 2 |
| RFD (114) | RFD(106, 118) | 2 |
| RFD (115) | RFD(107, 119) | 2 |
| RFD (116) | RFD(108, 120) | 2 |
| RFD (117) | RFD(109, 121) | 2 |
| RFD (118) | RFD(110, 122) | 2 |
| RFD (119-122) | RFD(111-114)..SHIFTED | - |

| M(x) Polynomials: | XOR needed: |
|---|---|
| M123=$x^{123}+x^{111}+x^{92}+x^{84}+x^{64}+x^{46}+x^{23}+1$ | 2-WAY |
| M71=$x^{71}+x^{57}+x^{55}+x^{48}+x^{44}+x^{36}+x^{22}+x^{15}+x^{8}+1$ | 3-WAY |
| M53=$x^{53}+x^{38}+x^{36}+x^{33}+x^{30}+x^{27}+x^{25}+x^{7}+x^{3}+1$ | 4-WAY |
| G(x)=$x^{32}+x^{26}+x^{23}+x^{16}+x^{12}+x^{11}+x^{10}+x^{8}+x^{7}+x^{5}+x^{4}+x^{2}+x+1$ | 8-WAY |

US 6,189,124 B1

METHOD AND APPARATUS FOR A TWO-STEP CALCULATION OF CRC-32

FIELD OF THE INVENTION

This invention relates to error code calculation for data integrity checking in high speed telecommunications networks. The invention can be applied to Asynchronous Transfer Mode (ATM) networks in which high speeds require a fast process for data integrity checking.

BACKGROUND OF THE INVENTION

When digital messages are transmitted over telecommunication networks some errors can be expected and to insure data integrity, the serialized data is protected with Error Detection Codes. In high speed networks the lines have a low error rate and the security of data only requires a end to end process. The data integrity process is carried out at both the sending and the receiving station; the sending station calculates a code corresponding to the data and the transmitting station checks the integrity of the data and code. ATM uses a Frame Check Sequence (FCS) field derived from Cyclic Redundancy Check (CRC) Error Detection codes for error checking. The CRC codes are often used for checking integrity of data because they are easy to implement and they detect a large class of errors. The access nodes of an ATM network have the responsibility of data integrity. The originating node calculates the redundancy bits constituting the Frame Check Sequence, (FCS) which is appended by the originating system to the bit stream to be checked before sending it over the network. At the destination node, the bit stream plus its initial FCS are checked using similar CRC computation. There is no error in transmission if the computed FCS at the destination node yields a constant value depending on the type of CRC used. It is noted that in an ATM network the FCS calculation and checking are performed in the ATM adapter cards of ATM access nodes (et the entry of the network), in ATM-connected user end stations, and also in ATM nodes providing internetworking functions such as ATM-Frame Relay.

CRC codes are generated by a generator polynomial characterizing the type of CRC; the CRC code corresponding to the polynomial representation of a bit stream to be encoded is the remainder of the polynomial division of the polynomial representation of the bit stream by the polynomial generator. CRC calculations are described, for instance, in 'Téléinformatique I' of Henri Nussbaumer, 1987, Presses informatiques romandes CH-1015 Lausanne. The FCS code has been standardized for data integrity checking as described in the ANSI X3.139-1987 document pages 28 and 29 and in Appendix B thereto. All the CRC codes constitute a finite Galois Field. If the polynomial generator is of degree d, the Galois Field of the CRC codes has $2^d-1$ elements. The simple implementation of codes based on CRC is due to the simple characteristics of calculations in the finite Galois Fields.

In ATM networks different types of connections may be established depending on the quality of service required. Some ATM standards organizations (ITU-T The International Telecommunication Union—Telecommunication and ETSI The European Telecommunication Standardization Institute ) have differentiated different ATM Adaptation Layers (AALs) to provide generalized interworking across the ATM network. In the case of data, this AAL function takes frames (blocks) of data delivered to the ATM network, breaks them up into cells and adds necessary header information to allow rebuilding of the original block at the receiver. The AAL function includes checking for errors. The AAL function is implemented in the ATM end point which connects to the ATM network over the User Network Interface (UNI). As ATM switches usually contain endpoint functions as well as switch functions, AAL function is also implemented in ATM switches. Different AALs correspond to different traffic types. For instance, AAL1 is used for the service class A, circuit emulation, while AAL3/4 provides an end-to-end transport for both connection oriented (class C) and connectionless data (class D). AAL5 is designed to operate significantly more efficiently than AAL3/4 and has become the 1.364 ITU-T standard. The implementation of the AAL5 function is characterized by its low cost, compared to the other AAL implementations, in terms of overhead in the network nodes.

The ATM cell headers have their own error checking based on FCS calculation. The payload of 384 bits (48 bytes) of some ATM cells also uses FCS redundancy bits for error checking. The last 32 bits of cell payload of the last cell of a message conveyed through an AAL5 type connection represents the FCS code calculated on the message. The FCS code used for AAL5 cells is based on the CRC-32 codes calculations. We can represent bit streams as polynomials having coefficients values of 0 or 1, each power of X representing the weight of the bit in the stream. The addition of such polynomials correspond to logical addition (XORs) on their coefficients. The CRC-32 codes belong to the Galois Field generated by the following generator polynomial of degree 32:

$$G(X)=X^{32}+X^{26}+X^{23}+X^{22}+X^{16}+X^{12}+X^{11}+X^{10}+X^8+X^7+X^5+X^4+X^2+X+1$$

This generator polynomial of degree 32 was chosen as a standard for error checking in Ethernet and then chosen by the ATM standard for AAL5 error checking. The standard used for FCS calculation based on the polynomial generator of degree 32 is described in the publication 'American National Standard for information systems, fiber distributed data interface (FDDI)—token ring media access control (MAC)' ANSI X3.139-1987 of American National Standards Institute, inc.

If P(X) is the polynomial representation of a bit stream for which the 32 bit stream FCS is to be calculated:

$$FCS(P(X))=L(X)+Rem_G(X^{32}P(X)+X^kL(X)) \qquad \text{(Expression 1)}$$

with
k−1=degree of P(X)
$L(X)=X^{31}+X^{30}+ \ldots +X^2+X+1$.

Similarly, for FCS checking at the other side of a network when receiving a bit stream F'(X) including the appended FCS which has been calculated before sending, the checking is positive only if:

$$Rem_G(X^{32}(F'(X)+X^kL(X)))=C(X) \qquad \text{(Expression 2)}$$

with
$C(X)=X^{31}+X^{30}+X^{26}+X^{25}+X^{24}+X^{18}+X^{15}+X^{14}+X^{12}+X^{11}+X^{10}+X^8+X^6+X^5+X^4+X^3+X+1$;
k'−1=degree of F(X); and
$L(X)=X^{31}+X^{30}+ \ldots +X^2+X+1$ The FCS bottleneck in FCS computation and checking is the $Rem_G$ operation. The result is a CRC code belonging to the set of residue classes modulo G(X) of the polynomials of coefficients equal to 1 or 0 which is a ring, a linear algebra and which is a Galois Field having a multiplicative cyclic group because G(X), the generator polynomial of degree 32, is an irreducible polynomial.

The standard circuitry for computing the FCS of a bit stream message is a Linear Feedback Shift Register (LFSR) which carries out a bit by bit multiplication in the corresponding Galois Field. Each bit of the message is pushed in the LFSR, Most Significant Bit (MSB) first. The division is performed by the feedbacks. At the end of the process, the FCS (remainder of the division) is within the shift register. This method and type of circuitry is described, for instance in 'Error Checking Codes' by Peterson and Weldon, the MIT Press, 2nd edition, 1972. Although simple the method has obvious drawbacks. For example, since only one bit is processed at each shift, as many shifts as the number of bits is the message are needed in the LFSR. As the 32 bit CRC is used, a 32 bit register is needed. In this LFSR the remainder is calculated on a message shifted left by 32 bit places according to Expression 1 and Expression 2 for FCS calculation and checking. Still in order to be in accordance with Expression 1 and Expression 2, the polynomial addition of $X^k L(X)$ is realized by presetting the Shift register to all ones. Computing the CRC takes as many clock pulses as there are bits in the message.

A faster FCS calculation is provided in the patent application published under the reference EP 0614 294 entitled 'Method for generating a frame check sequence' disclosing a one (or more) byte (s) based FCS calculation, this method being more efficient than a bit based FCS calculation as with the LFSRs. This technique takes advantage of the properties of the operations in the Galois Fields. One property of the Galois Field is to have a root $\alpha$, an irreducible polynomial element of the Galois Field, characterized in that each element of the Galois Field is represented by $\alpha^d$, d being one integer greater or equal to zero and smaller than the number of elements of the Galois Field. According to a preferred embodiment described in the patent application, the calculation of FCS of a byte stream can be performed byte by byte, each new byte read being XORed with the result of the multiplication of the previous FCS value by the $\alpha^8$ element of the Galois Field. The multiplier is the implementation of the $\alpha^8$ multiplication in the Galois Field, this means modulo the polynomial generator G(X). The mathematical formula illustrating the method is expressed in the Galois Field as follows:

$$FCS(N+1) = FCS(N) \otimes \alpha^8 + B(N+1) \quad \text{(Expression 3)}$$

where FCS(N) is the FCS of the message consisting of the N previous bytes; B(N+1) is the polynomial representation of the next byte (new byte) of the message;

$\otimes$ is the sign of the polynomial multiplication in the Galois Field (a two step operation comprising a first step to multiply the two polynomials and a second step to take the remainder of the result in the division by G);

$\alpha$ is an irreducible polynomial, root of the Galois Field generated by G; and $\alpha^8$ is the 9th element of the Galois Field (simple element having only one coefficient equal to 1 in its polynomial representation).

This per byte calculation of the FCS according to Expression 3 is implemented using a Multiplier adder. ATM access nodes have this Multiplier adder implemented in their adapter cards. The Multiplier adder of the prior art when applied to the computation of CRC-32 based FCS requires the combinational operations described in the following table 1 to be implemented. The 32 bits of the FCS, as shown in the first column, calculated at the reception of a new byte N, result in the combination of the bits of the FCS calculated on the preceeding bytes (up to N−1), as shown in the second column, with the bits of the incoming new byte (B(i)). In the third column is indicated the number of XOR entries necessary to the combination of the corresponding bit. It varies from 2-way to 8-way XORs. As with the LSFR solution the register receiving the 32 bit stream CRC is preset to all ones.

TABLE 1

| FCS(0)  | B(0), FCS(24, 30)                    | 3 |
| FCS(1)  | B(1), FCS(24, 25, 30, 31)            | 5 |
| FCS(2)  | B(2), FCS(24, 25, 26, 30, 31)        | 6 |
| FCS(3)  | B(3), FCS(25, 26, 27, 31)            | 5 |
| FCS(4)  | B(4), FCS(24, 26, 27, 28, 30)        | 6 |
| FCS(5)  | B(5), FCS(24, 25, 27, 28, 29, 30, 31)| 8 |
| FCS(6)  | B(6), FCS(25, 26, 28, 29, 30, 31)    | 7 |
| FCS(7)  | B(7), FCS(24, 26, 27, 29, 31)        | 6 |
| FCS(8)  | FCS(0, 24, 25, 27, 28)               | 5 |
| FCS(9)  | FCS(1, 25, 26, 28, 29)               | 5 |
| FCS(10) | FCS(2, 24, 26, 27, 29)               | 5 |
| FCS(11) | FCS(3, 24, 25, 27, 28)               | 5 |
| FCS(12) | FCS(4, 24, 25, 26, 28, 29, 30)       | 7 |
| FCS(13) | FCS(5, 25, 26, 27, 29, 30, 31)       | 7 |
| FCS(14) | FCS(6, 26, 27, 28, 30, 31)           | 6 |
| FCS(15) | FCS(7, 27, 28, 29, 31)               | 5 |
| FCS(16) | FCS(8, 24, 28, 29)                   | 4 |
| FCS(17) | FCS(9, 25, 29, 30)                   | 4 |
| FCS(18) | FCS(10, 26, 30, 31)                  | 4 |
| FCS(19) | FCS(11, 27, 31)                      | 3 |
| FCS(20) | FCS(12, 28)                          | 2 |
| FCS(21) | FCS(13, 29)                          | 2 |
| FCS(22) | FCS(14, 24)                          | 2 |
| FCS(23) | FCS(15, 24, 25, 30)                  | 4 |
| FCS(0)  | B(0), FCS(24, 30)                    | 3 |
| FCS(1)  | B(1), FCS(24, 25, 30, 31)            | 5 |
| FCS(2)  | B(2), FCS(24, 25, 26, 30, 31)        | 6 |
| FCS(24) | FCS(16, 25, 26, 31)                  | 4 |
| FCS(25) | FCS(17, 26, 27)                      | 3 |
| FCS(26) | FCS(18, 24, 27, 28, 30)              | 5 |
| FCS(27) | FCS(19, 25, 28, 29, 31)              | 5 |
| FCS(28) | FCS(20, 26, 29, 30)                  | 4 |
| FCS(29) | FCS(21, 27, 30, 31)                  | 4 |
| FCS(30) | FCS(22, 28, 31)                      | 3 |
| FCS(31) | FCS(23, 29)                          | 2 |

The CRC-32 calculation is based on a polynomial of degree 32 which has many more terms (15) than any other CRC polynomial defined by the standards organizations of the Telecommunications industry. The amount of calculations needed to handle a new incoming byte of data in a per byte computation is large if the number of terms of the polynomial is large, because a large number of bits of the current intermediate result must be combined to get each bit of the next byte. As shown on the table above, a 8-way XOR will be used for CRC-32 which is quite a complex operation. As a matter of fact, the processing complexity of the N-way increases with N. This complexity tends to go against the intrinsic speed advantage of the per byte computation by requiring that more processing be done at each cycle. That is why with current technologies (for instance standard sub-micron CMOS technology), it is very difficult to perform the FCS calculations for data integrity checking of payload while sustaining media speed. Particularly over OC12 (622 Mbps) optical links a cell (48 bytes) should be processed in 700 ns. In the ATM adaptation layer, the FCS calculation/checking of AAL5 cells FCS should not be delayed: particularly AAL5 cells are used for network management messages which must be recognized immediately in order to enable corrective actions. If not, a significant amount of data could be mishandled, generally discarded, because some resources (buffers, bandwidth) were not allocated on time.

It is the object of the invention to reduce process time of the payload FCS calculation based on CRC-32 codes of packets sent over the network and the process of checking the cell payload FCS in the packets received on the other side of the network.

SUMMARY OF THE INVENTION

The invention provides a method to calculate the CRC-32 (Cyclic Redundancy Check) code generated by the polynomial generator of degree 32, $G(X)=X^{32}+X^{26}+X^{23}+X^{22}+X^{16}+X^{12}+X^{11}+X^{10}+X^{8}+X^{7}+X^{5}+X^{4}+X^{2}+X+1$, of a bit stream, said method comprising the steps of:

calculating (12) the CRC-R code generated by M(X), a multiplier of G(X) of degree R, of the bit stream and storing the R-bit stream CRC-R code (14); and calculating (16) the CRC-32 code generated by G(X) of the R-bit stream CRC-R code, the resulting 32-bit stream (18) CRC-32 code being the CRC-32 of said bit stream.

The invention further provides apparatus implementing the steps of the method. The method and the apparatus are used particularly for the FCS computation and checking of the AAL5 cells in ATM network nodes.

With the solution of the invention, the process time is reduced compared to the solutions of the prior art and the implementation is simple; particularly the first CRC computation is implemented with 2-way XORs only and the second CRC computation is a one pass combination applied to a fixed sized bit stream, result of the first CRC computation.

BRIEF DESCRIPTION OF THE DRAWINGS

FIGS. 3A and 3B illustrate the bit combination according to the Multiplier/adder of the M123 first division.

FIG. 5 shows the matrix representation of the combinational array corresponding to the final division after a first division by M53.

FIG. 7 lists some possible multipliers of the polynomial generator of degree 32 and the corresponding N-way XOR necessary to the corresponding implementation of the corresponding Multiplier/adder.

DETAILED DESCRIPTION OF THE PREFERRED EMBODIMENT

Figure 1:
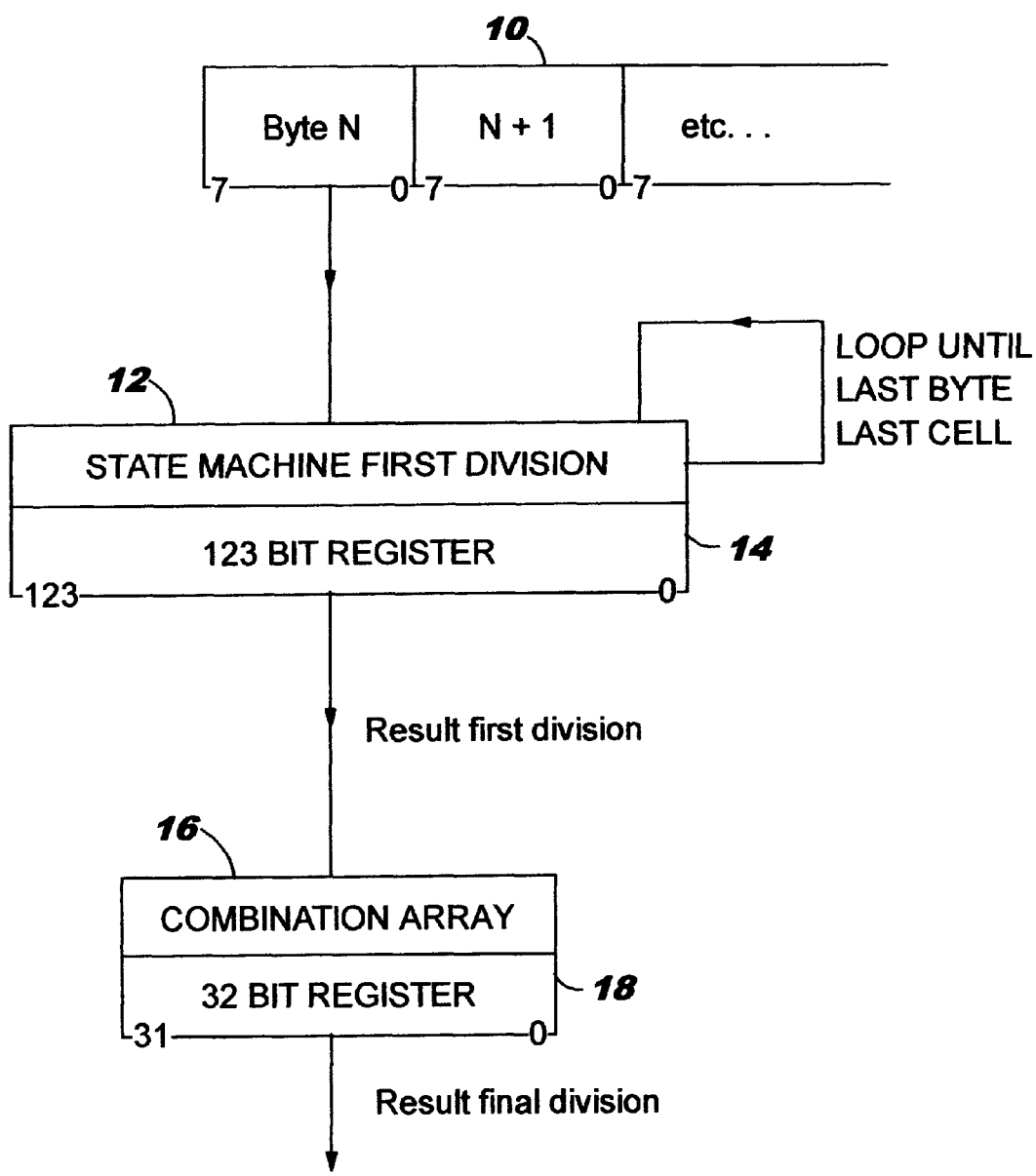
FIG. 1 depicts the general process for CRC-32 computation.

FIG. 1 shows the logical blocks of the CRC-32 calculation used for the computation of the FCS of a message segmented into ATM AAL5 cells in an ATM network. According to Expression 1, the CRC-32 calculated on an input bit stream is the remainder of the polynomial division of the polynomial representation of the input bit stream by the generator polynomial of degree 32 defined at the ATM forum:

$$G(X)=X^{32}+X^{26}+X^{23}+X^{22}+X^{16}+X^{12}+X^{11}+X^{10}+X^{8}+X^{7}+X^{5}+X^{4}+X^{2}+X+1$$

The remainder is a polynomial of a degree smaller than 32 representing a 32 bit stream. The input bit stream, according to Expression 1, is based on the initial bit stream message. The remainder fills the 32 bit FCS field appended to the payload of the last ATM AAL5 cell of the segmented message. The same CRC-32 calculation is used for checking the integrity of a message arriving at a destination point of an ATM network according to Expression 2. For checking, the CRC-32 is calculated on the bit stream constituting the payload of all the AAL5 cells of a message, the last payload including the appended FCS according to Expression 2.

In the preferred embodiment of the CRC-:32 calculation illustrated in FIG. 1, the logical block (12) represents the state machine for the per byte recurrent division known from the prior art applied to the input bit stream read per byte 0, 1, . . . N, N+1 etc . . . (10) and the polynomial divider of degree 123:

$$M123(X)=X^{123}+X^{111}+X^{92}+X^{84}+X^{64}+X^{46}+X^{23}+1$$

which is a multiplier of the polynomial generator G of degree 32:

$$G(X)=X^{32}+X^{26}+X^{23}+X^{22}+X^{16}+X^{12}+X^{11}+X^{10}+X^{8}+X^{7}+X^{5}+X^{4}+X^{2}+X+1$$

The remainder of the division by M123, the first division of the FCS computation, is a polynomial of degree 122 or less which is written in a 123 bit register (14). The 123 bit stream is then entered, for the preferred embodiment, in a combinational array implementing the polynomial division of the 123 bit stream by the generator polynomial of degree 32 (16); the result of this second division (the final division) is a polynomial of degree 31 or less representing a 32 bit stream written in a 32 bit register (18).

The principle used in this preferred embodiment consists in replacing the polynomial division by G by two successive polynomial divisions: one by the polynomial M123 which is a multiplier of G, the second, applied to the remainder of the first division, by the generator polynomial G of degree 32. The result can be illustrated by analogy with ordinary numbers: the remainder of the division by a multiplier of a number g, itself divided by g is equal to the remainder of the unique division by g. It is noted that any polynomial multiplier of G(X) could be used in this calculation. For reason of simplification in the hardware implementation of the CRC-32 calculation, M12:3 is preferably used; in other embodiments one of the following two polynomials can be also conveniently chosen:

$$M71(X)=X^{71}+X^{57}+X^{55}+X^{48}+X^{44}+X^{36}+X^{22}+X^{15}+X^{8}+1,$$

or $$M53(X)=X^{53}+X^{38}+X^{36}+X^{33}+X^{30}+X^{27}+X^{25}+X^{7}+X^{3}+1$$

The best result (minimum processing cycles) is obtained when the powers of the terms are all at least 8 bits apart.

Figure 2:
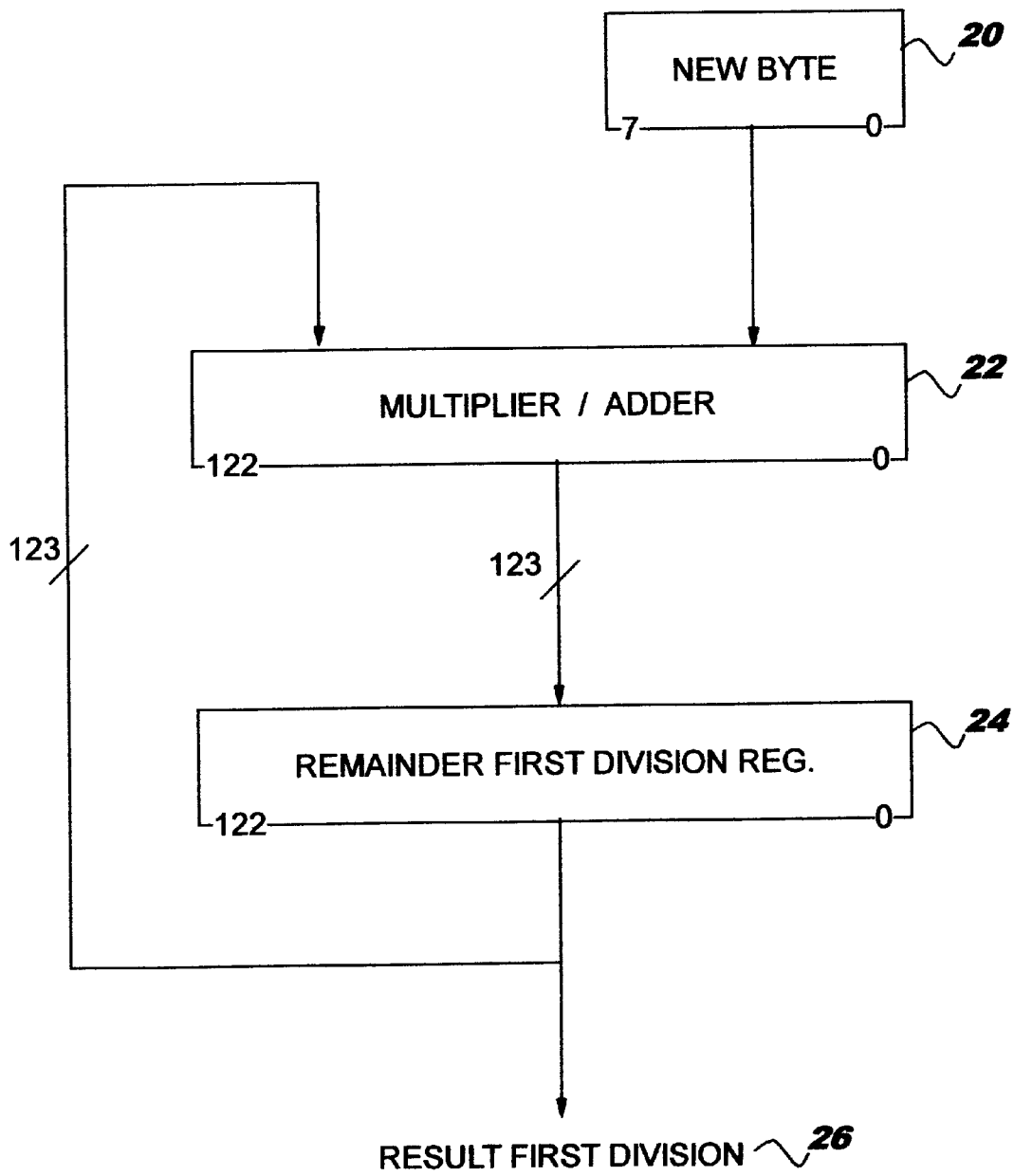
FIG. 2 shows the first division flow chart.

The following figures illustrate the two divisions of the logical blocks of the general process illustrated in FIG. 1. FIG. 2 is a flow-chart corresponding to the first division. The per byte computation of the prior art applied to an irreducible generator polynomial is applied to the non-irreducible polynomial, here M123, which is a multiplier of G(X). Each new input byte of the input bit stream is entered in the multiplier/adder of the prior art performing the CRC computation based on polynomial M123. As a matter of fact, the CRC computation is reduced to a combination of the current byte N+1 bit stream with the result of the same combination performed at the byte N. The result of the division is a 123 bit stream. The result of the division is one member of the multiplicative group generated by the polynomial M123. A primitive element α generates the multiplicative group generated by M123. The 123 bit stream representing the remainder of the division is stored in a 123 bit register (24). This result is then re-entered in the Multiplier/Adder (22) in combination with the entering new byte. When the last byte corresponding to the message for which the FCS is calculated is read and combined in the Multiplier/adder, the resulting 123 bit stream (24) is the result of the first division by M123 (24). As indicated in FIG. 2, if the multiplier of G used for the first division is M71, the resulting remainder is a 71 bit stream; similarly, if the multiplier of G used in the first division is M53, the resulting remainder is a 53 bit stream.

FIGS. 3A and 3B illustrate the combinational part of a state machine for the first division (12) in the case where the polynomial multiplier is M123. The input vector of 123 bits is combined with the incoming new byte N vector. The XOR gate entries are combined in accordance with the calculation in the multiplicative group generated by the polynomial M123 of degree 123. It is noted that the CRC-123 codes calculated with the multiplier/adder of the prior art form a ring and not a Galois Field as the polynomial M123 is not irreducible. However, the same calculation of the prior art for determining the combination of the bits is applied. The bit combinations are listed in the second column of the table, the first column providing the resulting 123 bit vector. The last column provides the number of XOR entries necessary to perform the corresponding resulting 123 bit vector calculation. The widest XOR needed is a 2-way XOR.

Figure 4A:
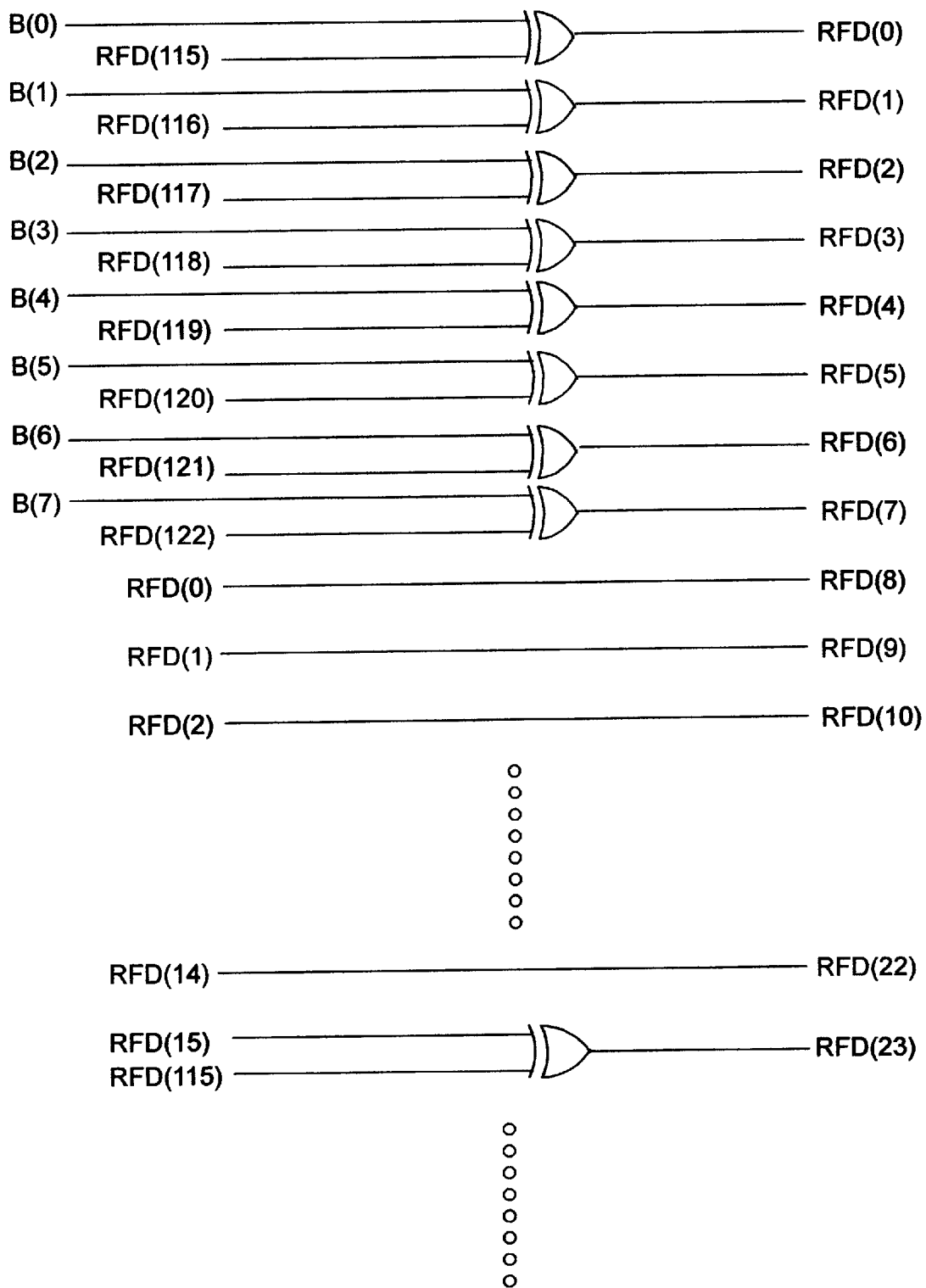
FIG. 4(4A and 4B) illustrate the hardware implementation of the Multiplier/adder of the M123 first division.
Figure 4B:
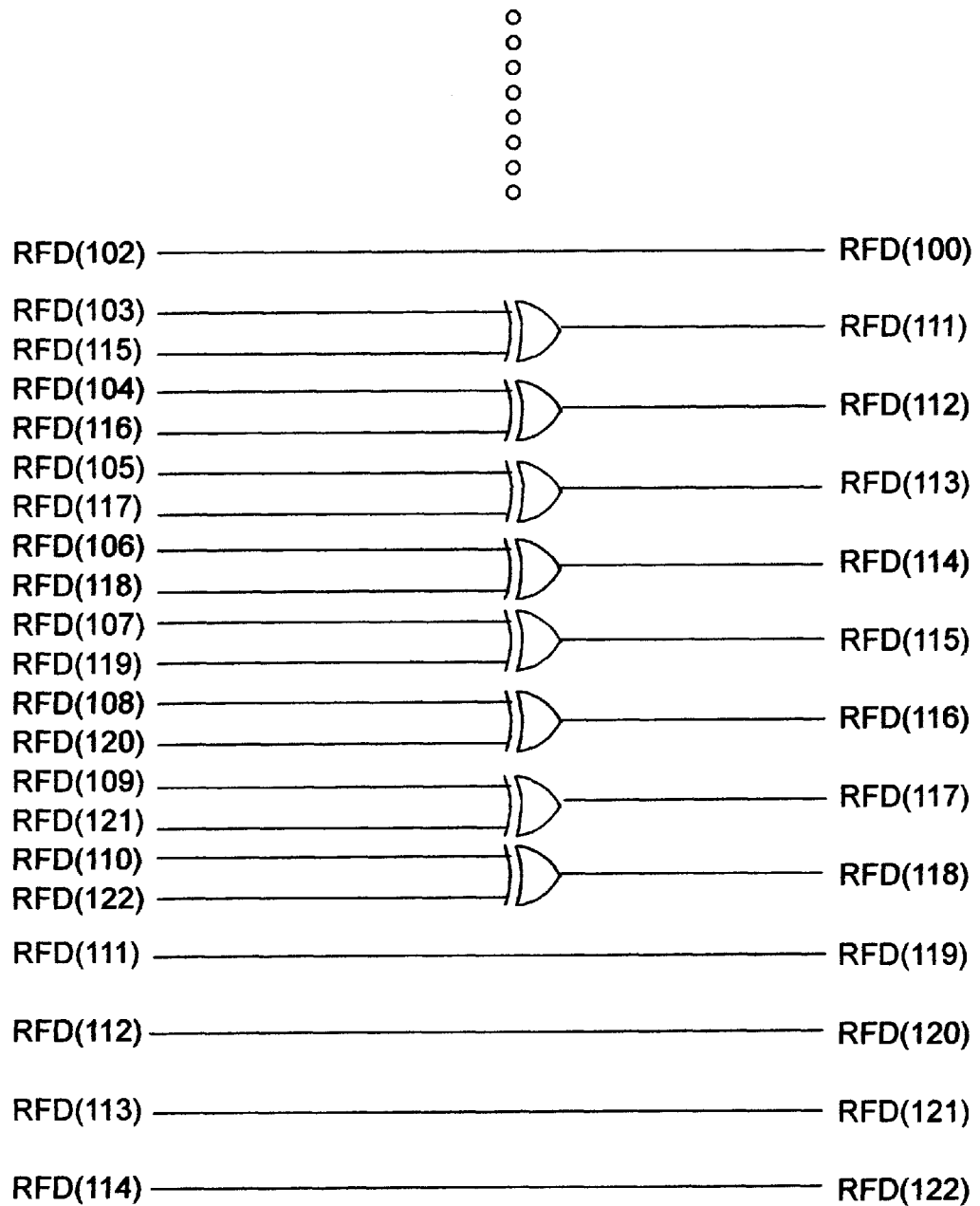

FIG. 4A and FIG. 4B illustrate one possible implementation of the combinational part of the state machine as listed in column 1 and 2 of FIGS. 3A and 3B. The 123 bit stream remainder of the first division (RFD) calculated up to byte N is combined with the bits of byte N+1. Only some bits of the resulting 123 bits remainder are represented in FIGS. 4A–4B: the first 11 bits (from RFD(0) to RFD(10)), the last bits (RFD(102) to RFD(122)) and the intermediate bits RFD(22) (unchanged from RFD(14)) and RFD(23). The gales used are 2-way XOR.

Figure 5:
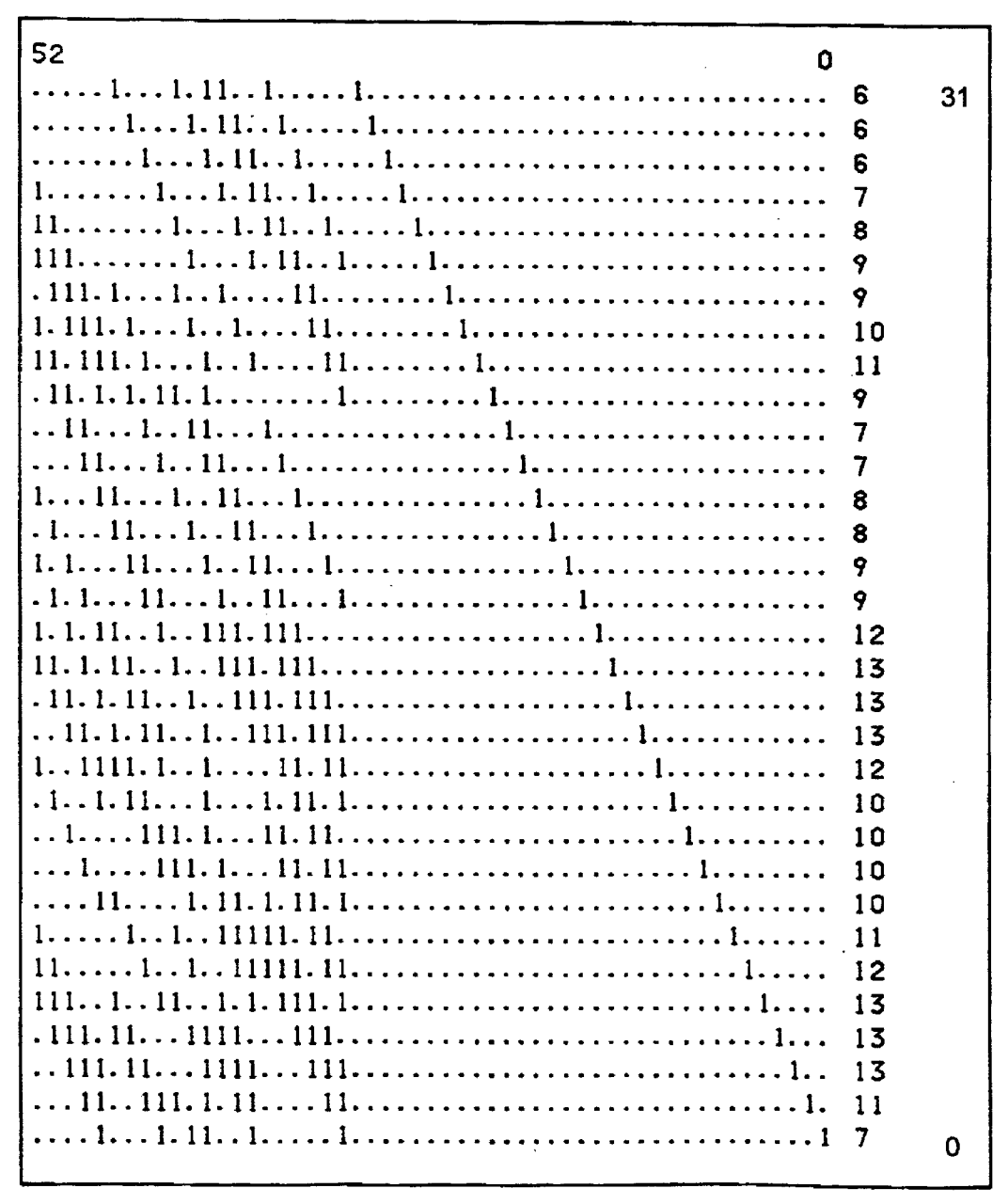

FIG. 5 illustrate the matrix used for performing the final division of the CRC-32 calculation (16). The remainder of the first polynomial division is divided in this step by G(X), the generator polynomial of degree 32, the resulting remainder is a polynomial of degree less than or equal to 31 corresponding to a 32 bit stream. This 32 bit stream is the resulting CRC-32. In the example illustrated in FIG. 5, the first division was performed by M53, a multiplier of G of degree 53. The 53-bit input vector, result of the first division, is applied on each of the 32 rows to yield the resulting 32 bit vector. The matrix rows correspond to the 53 first elements of the Galois Field generated by the polynomial generator of degree 32 having a root whose the polynomial representation is row 2. The implementation of such a polynomial division of a fixed length vector is a simple combinational array of XORs.

Figure 6:
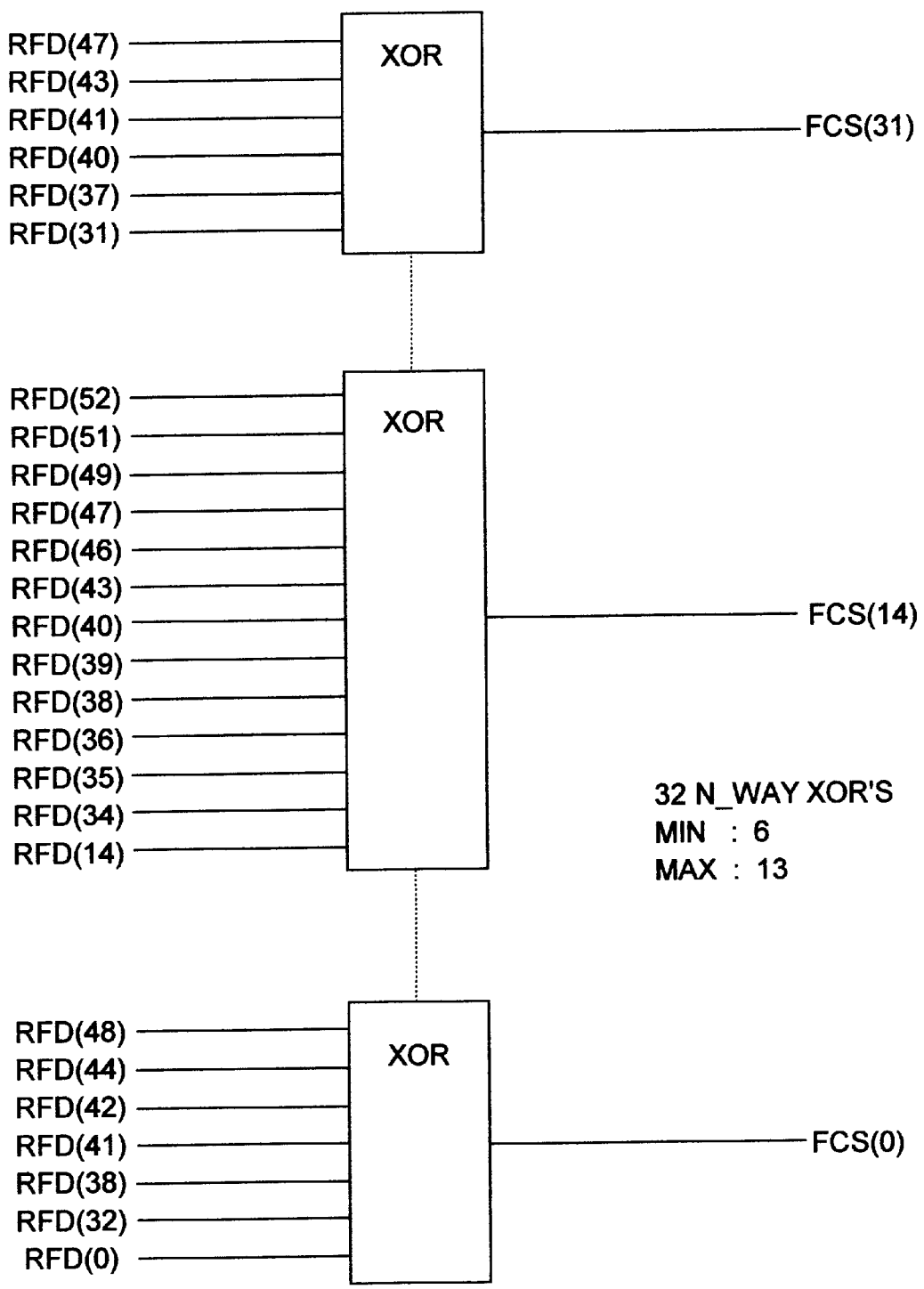
FIG. 6 illustrates the bit combination corresponding to the final division after a first division by M53.

FIG. 6 illustrates one possible implementation of the rows of the combinational matrix of FIG. 5. Each row of the matrix will be implemented with a N-way XOR combining some of the 53 bits to obtain one bit of the resulting CRC-32. The 32 N-way XORs will be from 3 to 13 entries types of XORs. Only the rows 0, 14 and 31 of the matrix of FIG. 4A and FIG. 4B are illustrated in FIG. 6. The 31st bit of the resulting vector is obtained by XORing the bits 47, 43, 41, 40, 37 and 31 of the 53 bit input vector. This operation needs a 6-way XOR. The 14th bit of the resulting vector is obtained by XORing the bits 52, 51, 49, 47, 46, 43, 40, 39, 38, 36, 35, 34, and 14 of the 53 bit input vector. This operation needs a 13-way XOR. The 0 bit of the resulting vector is obtained by XORing the bits 48, 44, 42, 41, 38, 32 and 0 of the 53 bit input vector. This operation needs a 7-way XOR.

FIG. 7 shows the various types of XOR needed for the first per byte division (12) according to the multiplier of G chosen. The simplest is M123 with 2-way XORs. The implementation of the first division with M71 requires 3-way XORs and with M53, 4 XORs. This simple type of combinational element is to be compared with the 8-way XORs needed for the division by G. The choice of the multiplier polynomial is led by the low number of inputs to XORs implying a simple implementation and a short process time. The simplest multiplier identified in FIG. 7 being M123 with only 2-way XORs.

While there has been described what is considered to be a preferred embodiment of the invention, variations and modifications will occur to those skilled in the art. Therefore, it is intended that the appended claims shall be construed to include both the preferred embodiment and all such variations and modifications as fall within the true spirit and scope of the invention.

What is claimed is:

1. A method comprising the steps of:

sequentially receiving a series of n-bit data bytes which together define a data message;

computing an intermediate cyclic redundancy check (CRC) code for the data message by polynomial division of received bytes using a multiple $M(x)$ of a generator polynomial $G(x)$;

storing the intermediate CRC code;

computing a final CRC code for the data message by polynomial division of the stored intermediate CRC code using the generator polynomial $G(x)$.

2. A method according to claim 1 further including the preliminary step of selecting a multiple $M(x)$, said selecting step retaining a multiple which best satisfies a combination of following properties:

the fewest possible terms;

the lowest possible degree; and the power of terms as evenly spread as possible.

3. A method according to one of claims 1 and 2 wherein the step of computing an intermediate CRC code is performed sequentially n-bits at a time as the data message is processed.

4. A method according to claim 2 wherein the step of selecting a multiple $M(x)$ chooses a multiple capable of cycling through two way XOR logic blocks alone.

5. A method according to claim 4 wherein the step of computing a final CRC code is performed with a combinational logic array.

6. The method according to claim 5 wherein said generator polynomial includes following polynomial:

$$G(x)=X^{32}+X^{26}+X^{23}+X^{22}+X^{16}+X^{12}+X^{11}+X^{10}+X^8+X^7+X^5+X^4+X^2+X+1.$$

7. The method according to claim 6 wherein said preferred multiples $M(x)$ include following polynomials:

$$M(x)X^{123}+X^{111}30\ X^{92}+X^{84}+X^{64}+X^{46}+X^{23}+1;$$

$$M(x)=X^{71}+X^{57}+X^{55}+X^{48}+X^{44}+X^{36}+X^{22}+X^{15}+X^8+1;$$

$$M(x)=X^{53}+X^{38}+X^{36}+X^{33}+X^{30}+X^{27}+X^{25}+X^7+X^3+1.$$

8. The method according to claim 7 wherein said preferred multiples $M(x)$ are used to perform sequentially said computing of said CRC over said data message 8-bit at a time.

* * * * *